United States Patent
Liaw

(10) Patent No.: US 10,032,665 B2
(45) Date of Patent: Jul. 24, 2018

(54) METHOD OF FORMING SEMICONDUCTOR DEVICE

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/398,752

(22) Filed: Jan. 5, 2017

(65) Prior Publication Data
US 2018/0151417 A1    May 31, 2018

Related U.S. Application Data

(60) Provisional application No. 62/427,943, filed on Nov. 30, 2016.

(51) Int. Cl.
*H01L 21/00* (2006.01)
*H01L 21/768* (2006.01)
*H01L 23/522* (2006.01)
*H01L 23/528* (2006.01)
*H01L 23/532* (2006.01)

(52) U.S. Cl.
CPC .. *H01L 21/76816* (2013.01); *H01L 21/76877* (2013.01); *H01L 23/528* (2013.01); *H01L 23/5226* (2013.01); *H01L 23/53209* (2013.01); *H01L 23/53214* (2013.01); *H01L 23/53228* (2013.01); *H01L 23/53257* (2013.01)

(58) Field of Classification Search
CPC ......... H01L 21/76816; H01L 21/76877; H01L 23/5226; H01L 23/528; H01L 23/53257; H01L 23/53228; H01L 23/53214; H01L 23/53209
See application file for complete search history.

(56) References Cited

U.S. PATENT DOCUMENTS

| | | | | |
|---|---|---|---|---|
| 5,593,522 A | * | 1/1997 | Neddenriep | .......... B60C 9/1821 152/458 |
| 5,721,146 A | * | 2/1998 | Liaw | ................. H01L 21/28512 257/E21.162 |
| 8,486,840 B2 | | 7/2013 | Liaw | |
| 8,847,361 B2 | | 9/2014 | Liaw et al. | |
| 8,969,974 B2 | | 3/2015 | Liaw | |

* cited by examiner

*Primary Examiner* — Richard Booth
(74) *Attorney, Agent, or Firm* — McClure, Qualey & Rodack, LLP

(57) ABSTRACT

A method for forming a semiconductor device includes the following steps. An IMD layer is provided on a substrate. A plurality of block patterns is formed on the IMD layer. A plurality of dummy patterns is formed on the IMD layer and the block patterns. Portions of the IMD layer uncovered by the dummy patterns and the block patterns are etched to form a plurality of trenches of the IMD layer. After the trenches of the IMD layer are formed, the dummy patterns and the block patterns are removed, and a metal material is filled into the trenches to form metal lines.

20 Claims, 19 Drawing Sheets

METHOD OF FORMING SEMICONDUCTOR DEVICE

RELATED APPLICATIONS

This application claims priority to U.S. Provisional Application Ser. No. 62/427,943, filed Nov. 30, 2016, which is herein incorporated by reference.

BACKGROUND

The semiconductor industry has experienced exponential growths, and lithographic technologies such as immersion lithography (e.g. 193-immersion lithography), extreme ultraviolet (EUV) lithography and e-beam lithography have been developed for fabricating semiconductor products. On the other hand, in 7 nm and beyond technology generations, metal pitches are pushed to have a critical dimension less than 40 nm. Among the lithography technologies, EUV and e-beam lithography tools are still not ready for manufacturing semiconductor chips of 7 nm technology node or beyond, and immersion lithography tools are the tools deployed for pattern printing. However, it becomes much more difficult to use the immersion lithography tool for pattern printing at such advanced technology node due to the intrinsic resolution barrier of the immersion lithography tool.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
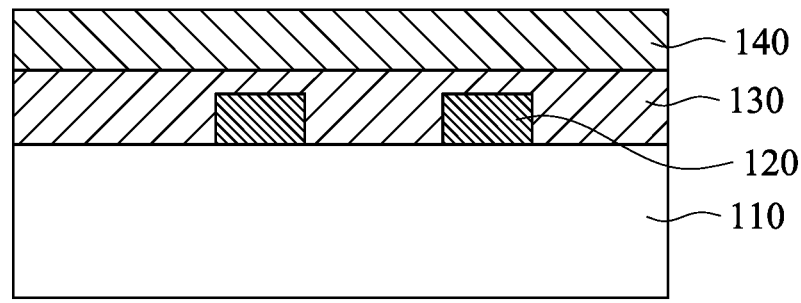
FIG. 1A to FIG. 1E are schematic cross-sectional views of intermediate stages in the formation of metal lines of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

It will be understood that, although the terms "first", "second", etc., may be used in the claims to describe various elements, these elements should not be limited by these terms, and these elements correspondingly described in the embodiments are presented by different reference numbers. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Embodiments of the present disclosure are directed to methods of forming a semiconductor device, and more particularly to methods of forming metal lines of a semiconductor device. Embodiments of the present disclosure adopt spacer lithography with particular block patterns which are used in back-end-of-line (BEOL) processes for formation of metal lines. Embodiments of the present disclosure may have advantages of, for example, overcoming intrinsic resolution barrier of immersion lithography (e.g. 193-immersion lithography), forming target features with a critical dimension which may be beyond the patterning limitation of the typical lithography tools, and having a capability of forming target features (such as trenches or metal lines) within a critical dimension range of about 2-30 nm with better control of critical dimension uniformity. In comparison with conventional deposition and etching processes, embodiments of the present disclosure may extend the typical lithography tool to future technology generations with throughput advantage and cost efficiency.

FIG. 1A to FIG. 1E are schematic cross-sectional views of intermediate stages in the formation of metal lines of a semiconductor device in accordance with some embodiments of the present disclosure. In FIG. 1A, an intermediate (IMD) layer 110 is provided, and block patterns 120 are formed on the IMD layer 110. The IMD layer 110 may be provided having silicon oxide, silicon nitride, silicon oxynitride, tetraethylorthosilicate (TEOS) oxide, undoped silicon glass, doped silicon glass such as borosilicate glass (BSG), phosphosilicate glass (PSG), borophosphosilicate glass (BPSG) and fluorosilicate glass (FSG), low-k electric, combinations thereof, and/or another suitable material. The dielectric constant of the high-K dielectric for the IMD layer 110 may be less than 3. The block patterns 120 may be formed from polysilicon, amorphous silicon, silicon-based conductor, boron doped polysilicon, boron doped amorphous silicon, titanium nitride, tantalum nitride, silicon nitride, high-K dielectric, combinations thereof, and/or another suitable material. The dielectric constant of the high-K dielectric for forming the block patterns 120 may be greater than 10. A planarization process, such as a chemical mechanical polishing (CMP) process, may also be utilized to planarize the block patterns 120. The block patterns 120 may be formed by utilizing a deposition process and a patterning process (e.g. a lithography process and an etching process).

After the formation of the block patterns 120, a planarization layer 130 is formed on and covers the block patterns 120, and a dummy layer 140 is formed on the planarization layer 130. The planarization layer 130 may be formed from oxide, nitride, silicon oxynitride, combinations thereof, and/or another suitable material. The planarization layer (not shown) may be formed by utilizing a deposition process and a CMP process. The dummy layer 140 may be formed from oxide, nitride-containing dielectric, silicon nitride, silicon oxynitride, titanium nitride, tantalum nitride, combinations thereof, and/or another suitable material.

Figure 1B:
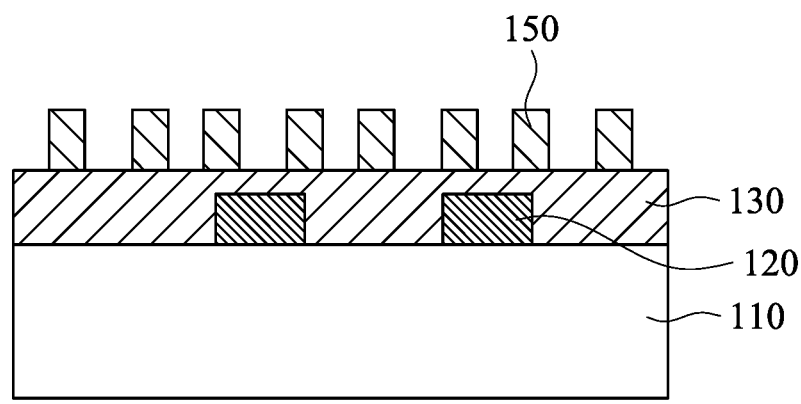

In FIG. 1B, the dummy layer 140 are patterned to form dummy patterns 150. The patterning process for forming the dummy patterns 150 may be performed by using, for example, a positive photoresist in combination with a clear tone mask, or a negative photoresist in combination with a dark tone mask. The patterning process for forming the dummy patterns 150 may include a lithography process and an etching process.

Figure 1C:
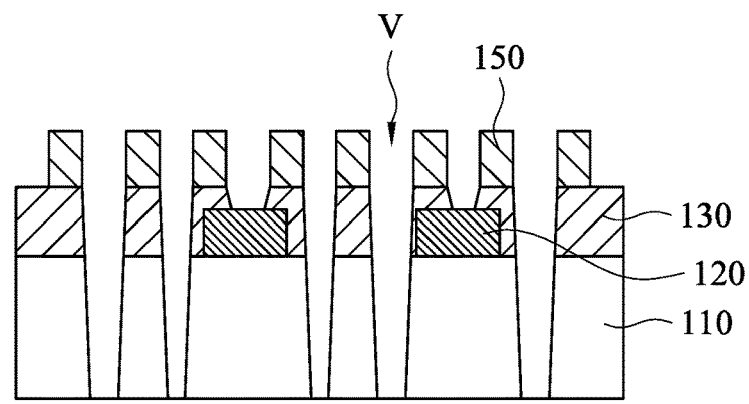

In FIG. 1C, portions of the planarization layer 130 uncovered by the dummy patterns 150 and portions of the IMD layer 110 uncovered by the dummy patterns 150 and the block patterns 120 are etched to form trenches V. In this step, the dummy patterns 150 and the block patterns 120 are used as hard masks, and the IMD layer 110 is etched back in the portions uncovered by the dummy patterns 150 and the block patterns 120. The etching process for forming the trenches V may be an anisotropic etching process with low selectivity with respect to the block patterns 120 and the dummy patterns 150, such as a reactive ion etching process, a plasma etching process, a dry etching process, a wet etching process, or another suitable etching process.

Figure 1D:
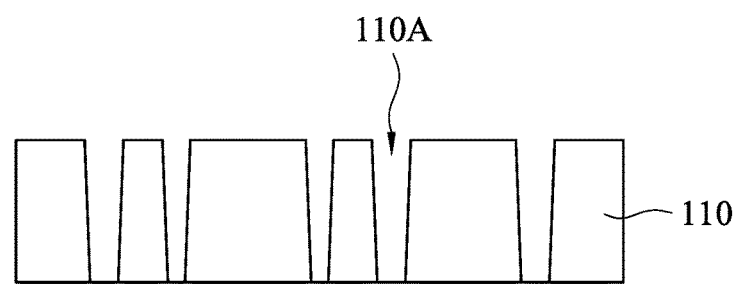

In FIG. 1D, after the trenches V are formed, the dummy patterns 150, the planarization layer 130 and the block patterns 120 are removed, and the IMD layer 110 is remained with trenches 110A. The dummy patterns 150, the planarization layer 130 and the block patterns 120 may be removed by utilizing, for example, a dry etching process, a wet etching process, combinations thereof, or another suitable etching process.

Figure 1E:
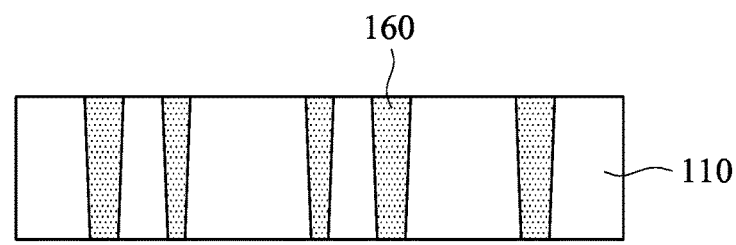

In FIG. 1E, a metal material is filled into the trenches 110A to form metal lines 160. The metal material for forming the metal lines 160 may be, for example, tantalum nitride, titanium nitride, titanium, cobalt, copper, tungsten, aluminum, combinations thereof, and/or another suitable material. After the trenches 110A are filled with the metal material, a CMP process may be performed to remove unwanted portion of the metal material on the IMD layer 110 and to planarize the upper surface of the metal lines 160.

In the embodiments of FIG. 1A to FIG. 1E, the block patterns 120 and the dummy patterns 150 are used as hard masks on different layers, which may help forming trenches 110A with narrower widths and good critical dimension uniformity by using the typical immersion lithography tool for forming the metal lines 160. In addition, the embodiments of FIG. 1A to FIG. 1E also help resolve patterning and topography issues induced by spacer patterning and removing processes.

Figure 2:
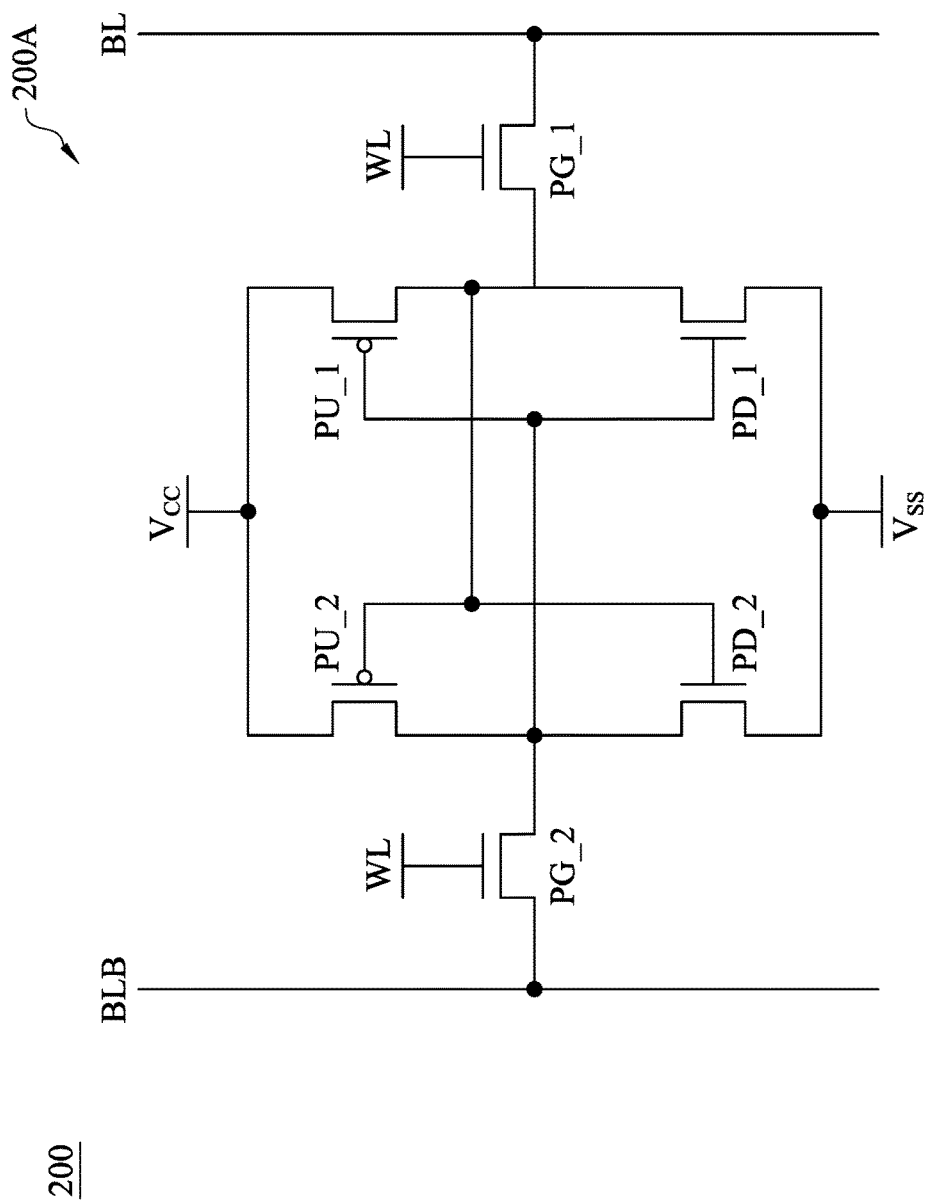
FIG. 2 is a circuit diagram of a memory device in accordance with some embodiments.

FIG. 2 is a circuit diagram of a memory device 200 in accordance with some embodiments. The memory device 200 is a static random access memory (SRAM) device which includes memory cells arranged in an array of rows and columns. In FIG. 2, only one memory cell 200A is shown for illustrative simplicity. As shown in FIG. 2, the memory cell 200A is a six transistor (6T) memory cell, which includes two pull-up transistors PU_1 and PU_2, two pull-down transistors PD_1 and PD_2 and two pass-gate transistors PG_1 and PG_2.

The pull-up transistors PU_1 and PU_2 and the pull-down transistors PD_1 and PD_2 are electrically coupled to form two cross-coupled inverters. The pull-up transistors PU_1 and PU_2 are P-type metal oxide semiconductor (PMOS) transistors, and the pull-down transistors PD_1 and PD_2 are N-type metal oxide semiconductor (NMOS) transistors. The drain of the pull-up transistor PU_1, the drain of the pull-down transistor PD_1, the gate of the pull-up transistor PU_2 and the gate of the pull-down transistor PD_2 are electrically coupled to each other, and the drain of the pull-up transistor PU2, the drain of the pull-down transistor PD_2, the gate of the pull-up transistor PU1 and the gate of the pull-down transistor PD_1 are electrically coupled to each other. The sources of the pull-up transistors PU_1 and PU_2 are electrically coupled to a power line $V_{CC}$, and the sources of the pull-down transistors PD_1 and PD_2 are electrically coupled to a complementary power line $V_{SS}$.

The gates of the pass-gate transistors PG_1 and PG_2 are electrically coupled to a word line WL which controls access to the memory cell 200A for reading data from the memory cell 200A or writing data to the memory cell 200A. The pass-gate transistors PG_1 and PG_2 are connected to a bit line BL and a complementary bit line BLB, respectively. The pass-gate transistor PG_1 is connected to a common node with the pull-up transistor PU_1 and the pull-down transistor PD_1, and pass-gate transistor PG_2 is connected to a common node with the pull-up transistor PU_2 and the pull-down transistor PD_2.

Figure 3A:
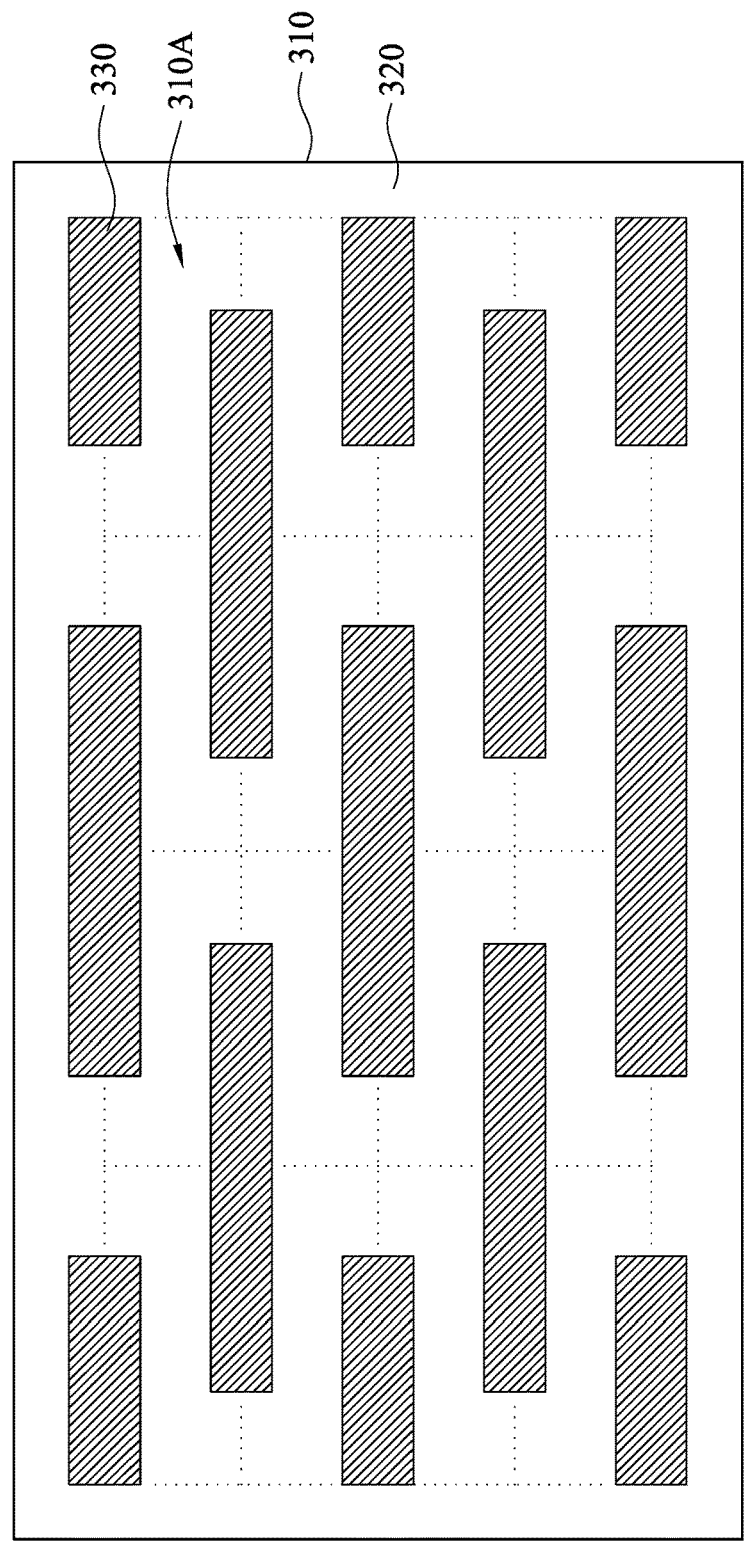
FIG. 3A to FIG. 3D are schematic top views of intermediate stages in the formation of metal lines of a semiconductor device in accordance with some embodiments of the present disclosure.

FIG. 3A to FIG. 3D are schematic top views of intermediate stages in the formation of metal lines of a semiconductor device in accordance with some embodiments of the present disclosure. The semiconductor device of which the metal lines are formed by the processes illustrated in FIG. 3A to FIG. 3D may be, for example, an SRAM device. As shown in FIG. 3A, an IMD layer 320 is provided on a substrate 310 which includes cell regions 310A in rows and columns, and block patterns 330 are formed on the IMD layer 320 and at boundaries of the cell regions 310A. In FIG. 3A and the following FIG. 3B to FIG. 3D, only four rows and four columns of cell regions 310A are shown for illustrative simplicity. The substrate 310 may be, for example, a semiconductor wafer, a silicon-on-insulator (SOI) substrate, a germanium-on-insulator (GOI) substrate, a bulk substrate, or the like. The IMD layer 320 may be formed from silicon oxide, silicon nitride, silicon oxynitride, TEOS oxide, undoped silicon glass, doped silicon glass such as BSG, PSG, BPSG and FSG, low-k electric, combinations thereof, and/or another suitable material. The IMD layer 320 may be formed by utilizing a deposition process such as a CVD process and a high density plasma CVD process, a spin-on coating process, a sputtering process, and/or another suitable process. The dielectric constant of the high-K dielectric for forming the IMD layer 320 may be less than 3. The IMD layer 320 may be formed with a thickness in a range from about 5 nanometers to about 200 nanometers.

The block patterns 330 may be formed from polysilicon, amorphous silicon, silicon-based conductor, boron doped polysilicon, boron doped amorphous silicon, titanium nitride, tantalum nitride, silicon nitride, high-K dielectric, combinations thereof, and/or another suitable material. The dielectric constant of the high-K dielectric for forming the block patterns 330 may be greater than 10. The block patterns 330 may be formed by utilizing a deposition process and a patterning process (e.g. a lithography process and an etching process). A planarization process, such as a CMP process, may also be utilized to planarize the block patterns 330. The block patterns 330 may be formed with a thickness in a range from about 20 angstroms to about 1000 angstroms.

Figure 3B:
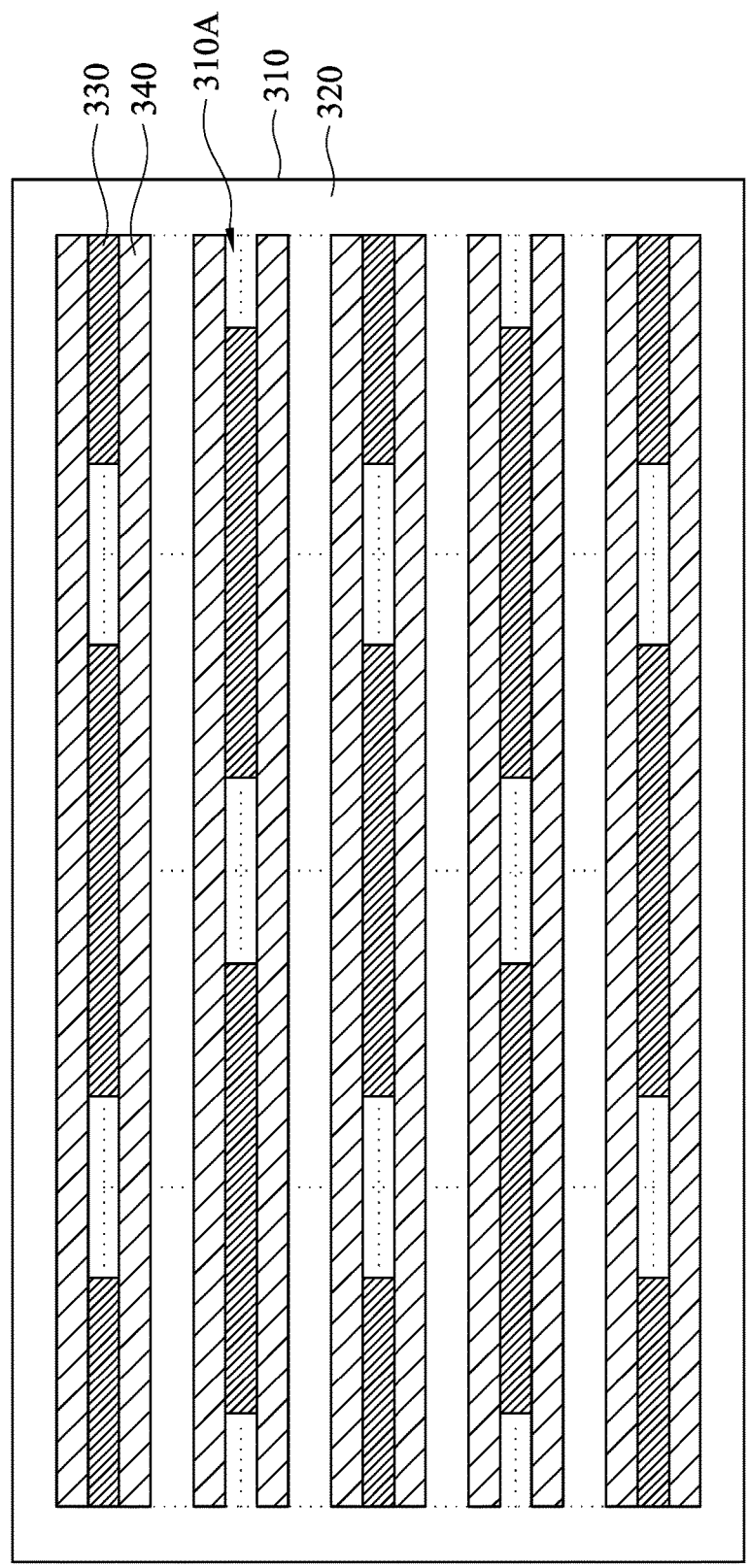

In FIG. 3B, a planarization layer (not shown) is formed on the block patterns 330 and the IMD layer 320, and dummy patterns 340 are formed on the planarization layer (not shown). The planarization layer (not shown) may be formed from oxide, nitride, silicon oxynitride, combinations thereof, and/or another suitable material. The planarization layer (not shown) may be formed by utilizing a deposition process and a CMP process. As shown in FIG. 3B, some of the dummy patterns 340 are formed on both the block patterns 330 and the IMD layer 320, and the others are formed on the IMD layer 320 and between the block patterns 330. In some other embodiments, all of the dummy patterns 340 are formed the block patterns 330 and the IMD layer 320. The dummy patterns 340 may be formed from oxide, nitride-containing dielectric, silicon nitride, silicon oxynitride, titanium nitride, tantalum nitride, combinations thereof, and/or another suitable material. The dummy patterns 340 may be formed by utilizing a deposition process and a patterning process. The patterning process for forming the dummy patterns 340 may be performed by using, for example, a positive photoresist in combination with a clear tone mask, or a negative photoresist in combination with a dark tone mask. The patterning process for forming the dummy patterns 340 may include a lithography process and an etching process. The dummy patterns 340 may be formed with a thickness in a range from about 20 angstroms to about 2000 angstroms.

Figure 3C:
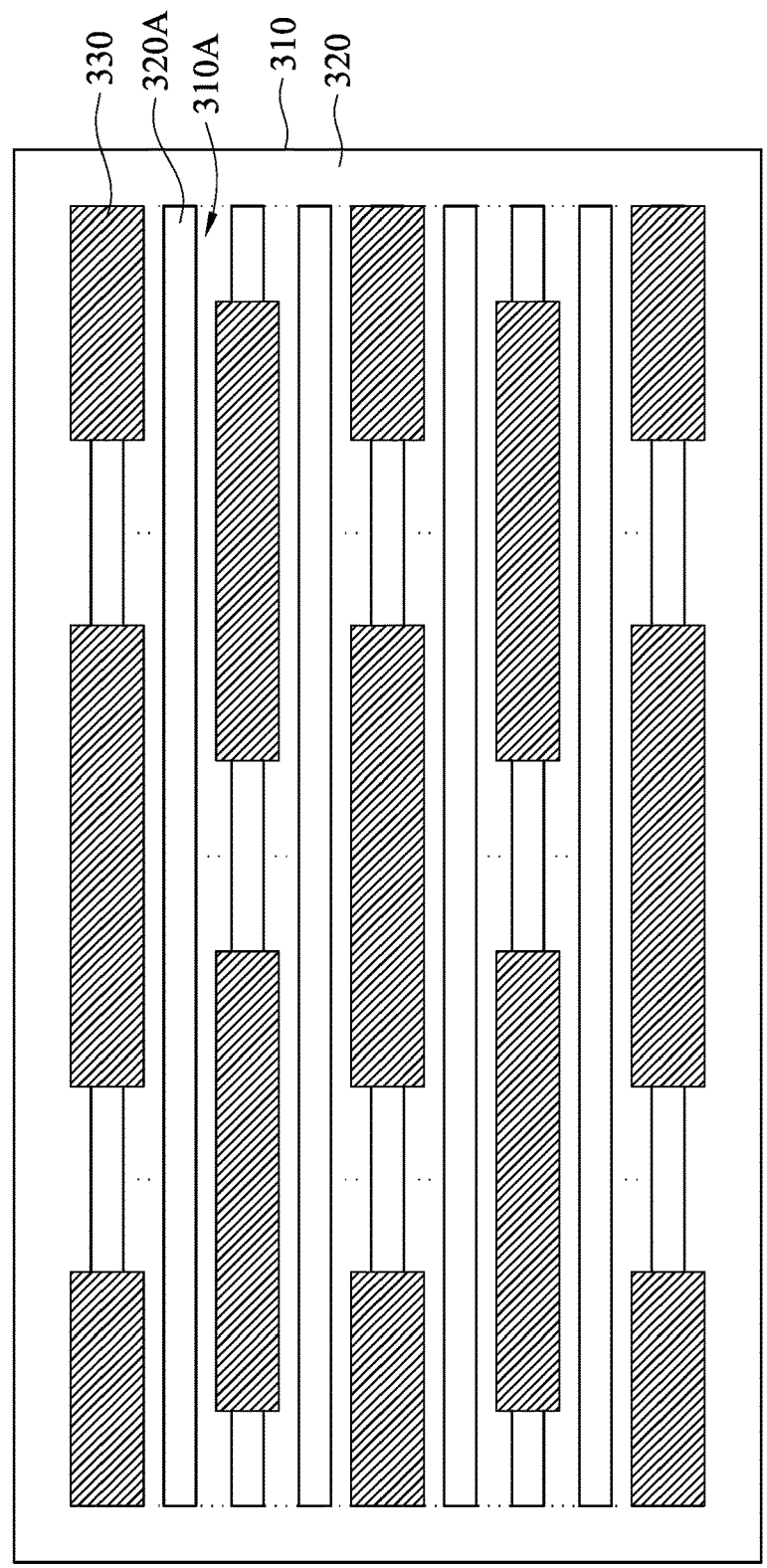

In FIG. 3C, portions of the IMD layer 320 uncovered by the dummy patterns 340 and the block patterns 330 are etched to form trenches 320A of the IMD layer 320. In this step, the dummy patterns 340 and the block patterns 330 are used as hard masks, and the IMD layer 320 is etched back in the portions uncovered by the dummy patterns 340 and the block patterns 330. The etching process for forming the trenches 320A may be an anisotropic etching process with low selectivity with respect to the block patterns 330 and the dummy patterns 340, such as a reactive ion etching process, a plasma etching process, a dry etching process, a wet etching process, or another suitable etching process.

Figure 3D:
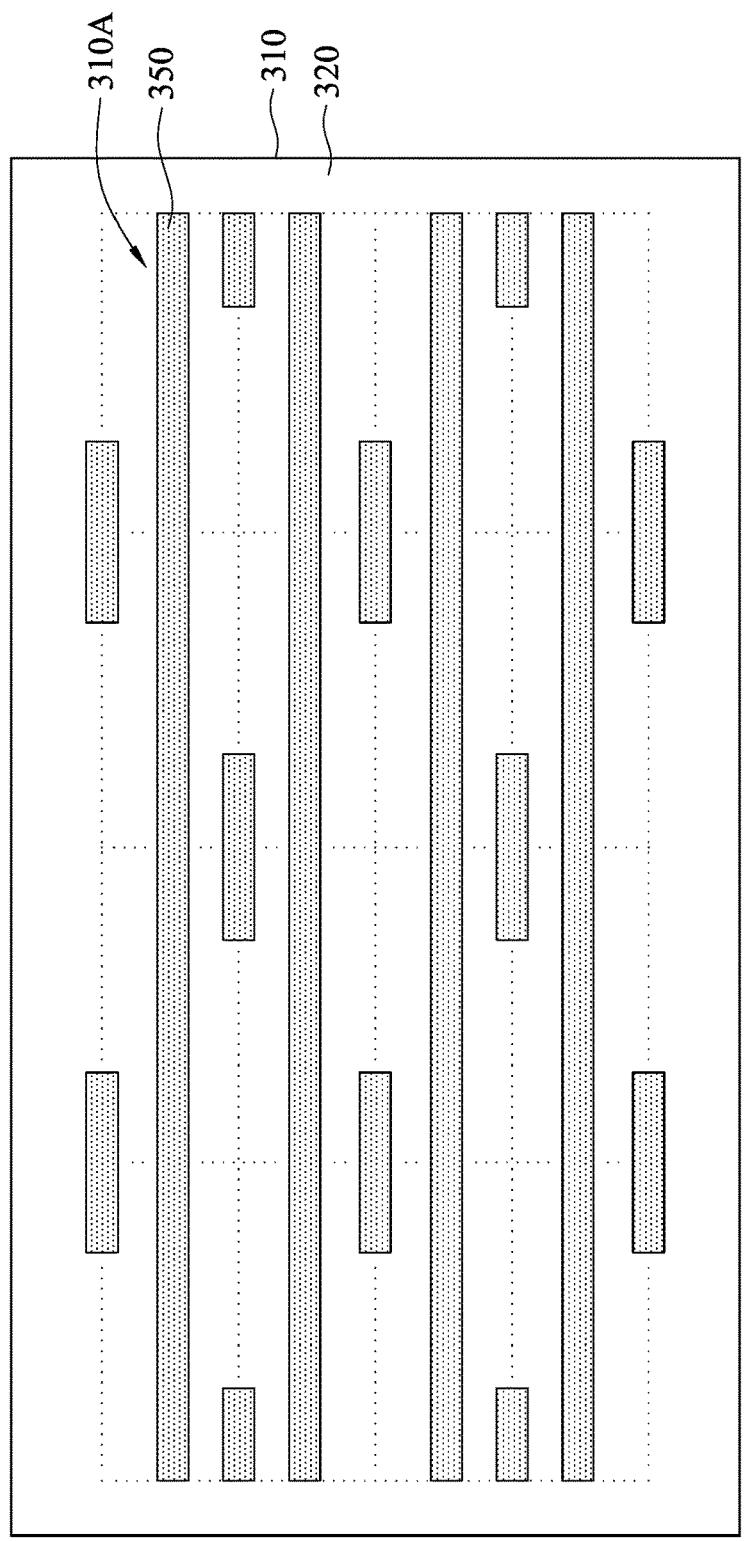

In FIG. 3D, after the trenches 320A are formed, the dummy patterns 340, the planarization layer (not shown) and the block patterns 330 are removed, and then a metal material is filled into the trenches 320A to form metal lines 350. The dummy patterns 340 and the block patterns 330 may be removed by utilizing, for example, a dry etching process, a wet etching process, combinations thereof, or another suitable etching process. The metal material for forming the metal lines 350 may be, for example, tantalum nitride, titanium nitride, titanium, cobalt, copper, tungsten, aluminum, combinations thereof, and/or another suitable material. The metal lines 350 may be formed by utilizing a CMP process.

The metal lines 350 may be, for example, word lines WL, power lines $V_{CC}$ and/or complementary power lines $V_{SS}$ of the memory device 200. In such case, subsequent processes are performed on the structure shown in FIG. 3D to form the other components (i.e. the bit lines BL, the complementary bit lines BLB, the pull-up transistors PU_1 and PU_2, the pull-down transistors PD_1 and PD_2 and the pass-gate transistors PG_1 and PG_2) of the memory device 200.

In the embodiments of FIG. 3A to FIG. 3D, the block patterns 330 and the dummy patterns 340 are used as hard masks on different layers, which may help forming trenches 320A with narrower widths and good critical dimension uniformity by using the typical immersion lithography tool for forming the metal lines 350. In addition, the embodiments of FIG. 3A to FIG. 3D also help resolve patterning and topography issues induced by spacer patterning and removing processes. The memory device 200 may be formed in a 7 nm technology node or advanced by applying the embodiments of FIG. 3A to FIG. 3D.

Figure 4A:
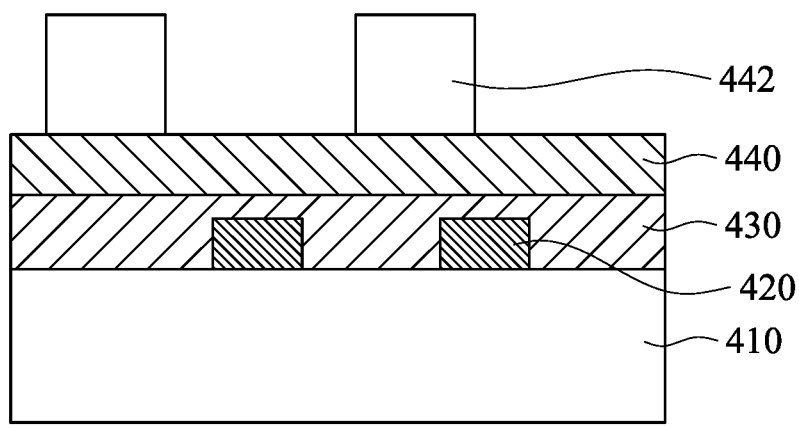
FIG. 4A to FIG. 4I are schematic cross-sectional views of intermediate stages in the formation of metal lines of a semiconductor device in accordance with some embodiments of the present disclosure.

FIG. 4A to FIG. 4I are schematic cross-sectional views of intermediate stages in the formation of metal lines of a semiconductor device in accordance with some embodiments of the present disclosure. In FIG. 4A, an IMD layer 410 is provided, and block patterns 420 are formed on the IMD layer 410. The IMD layer 410 may be provided having silicon oxide, silicon nitride, silicon oxynitride, TEOS oxide, undoped silicon glass, doped silicon glass such as BSG, PSG, BPSG and FSG, low-k electric, combinations thereof, and/or another suitable material. The dielectric constant of the high-K dielectric for the IMD layer 410 may be less than 3. The block patterns 420 may be formed from polysilicon, amorphous silicon, silicon-based conductor, boron doped polysilicon, boron doped amorphous silicon, titanium nitride, tantalum nitride, silicon nitride, high-K dielectric, combinations thereof, and/or another suitable material. The dielectric constant of the high-K dielectric for forming the block patterns 420 may be greater than 10. A planarization process, such as a chemical mechanical polishing (CMP) process, may also be utilized to planarize the block patterns 420. The block patterns 420 may be formed by utilizing a deposition process and a patterning process (e.g. a lithography process and an etching process).

After the formation of the block patterns 420, a planarization layer 430 is formed on and covers the block patterns 420, and a dummy layer 440 is formed on the planarization layer 430. The planarization layer 430 may be formed from oxide, nitride, silicon oxynitride, combinations thereof, and/or another suitable material. The planarization layer (not shown) may be formed by utilizing a deposition process and a CMP process. The dummy layer 440 may be formed from oxide, nitride-containing dielectric, silicon nitride, silicon oxynitride, titanium nitride, tantalum nitride, combinations thereof, and/or another suitable material.

Photoresists 442 are formed on the dummy layer 440 to define patterns of the dummy layer 440. The photoresists 442 may be positive photoresists used in combination with a clear tone mask or negative photoresists used in combination with a dark tone mask.

Figure 4B:
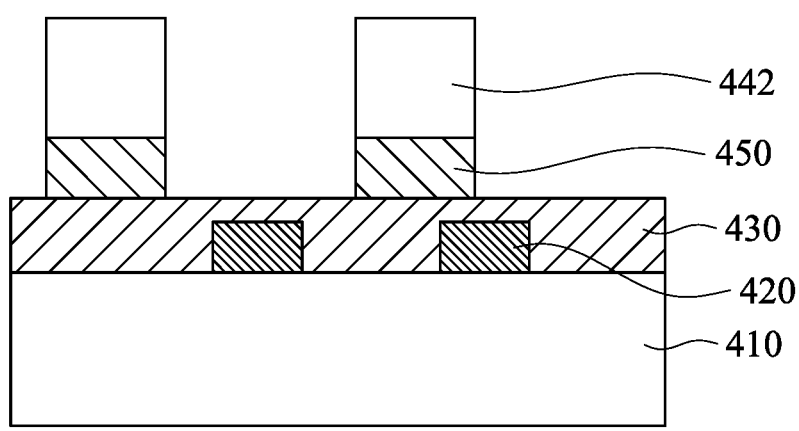

In FIG. 4B, the dummy layer 440 is etched back in the portions uncovered by the photoresists 442 to form dummy patterns 450. Some of the dummy patterns 450 may be overlapped with the block patterns 420, and the others may be staggered the block patterns 420. After the formation of the dummy patterns 450, the photoresists 442 are stripped.

Figure 4C:
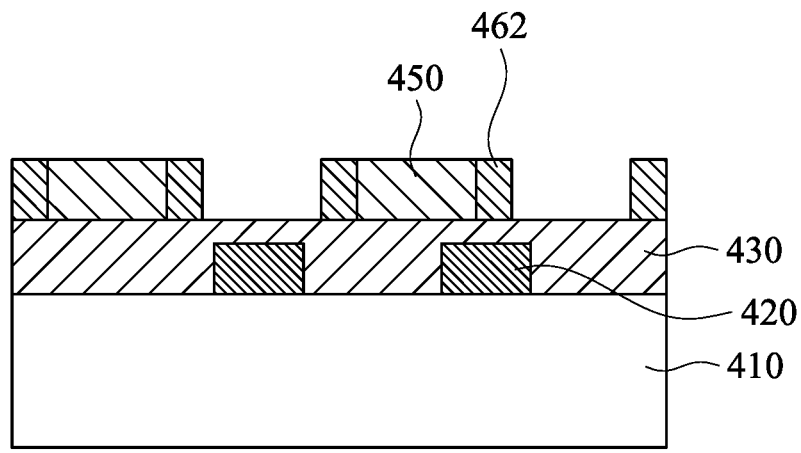

In FIG. 4C, first spacers 462 are formed on two opposite sidewalls of the dummy patterns 450. The first spacer 462 may be formed from silicon oxide, silicon nitride, silicon carbide, high-k dielectric, low-k dielectric, combinations thereof, or another suitable material. The first spacers 462 may be formed by utilizing a deposition process and a patterning process (e.g. a lithography process and an etching process).

Figure 4D:
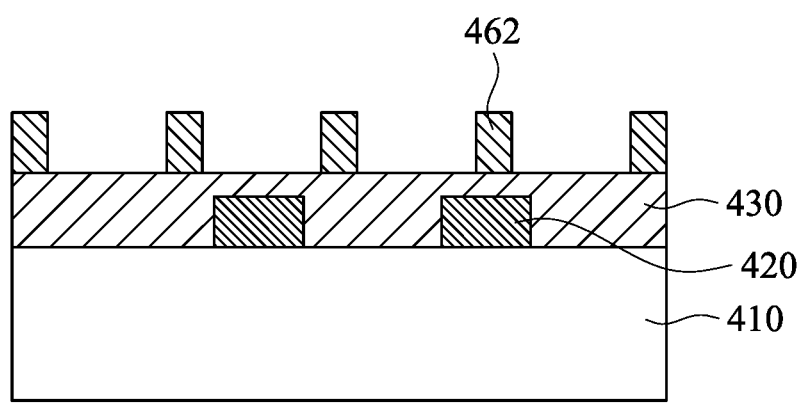

In FIG. 4D, after the first spacers 462 are formed, the dummy patterns 450 are then removed. The dummy patterns 450 may be removed by utilizing a dry etching process, a wet etching process, combinations thereof, or another suitable process.

Figure 4E:
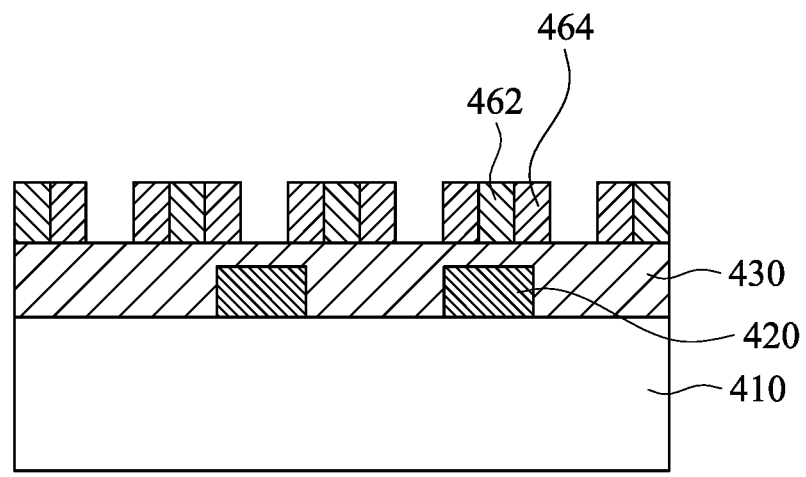

In FIG. 4E, second spacers 464 are formed on two opposite sidewalls of the first spacers 462. The second spacer 464 may be formed from silicon oxide, silicon nitride, silicon carbide, high-k dielectric, low-k dielectric, combinations thereof, or another suitable material. The second spacers 464 may be formed by utilizing a deposition process and a patterning process (e.g. a lithography process and an etching process).

Figure 4F:
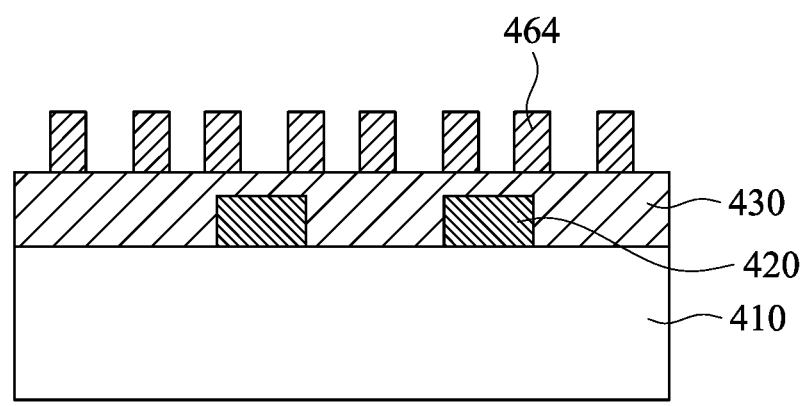

In FIG. 4F, after the second spacers 464 are formed, the first spacers 462 are then removed. The first spacers 462 may be removed by utilizing a dry etching process, a wet etching process, combinations thereof, or another suitable process.

Figure 4G:
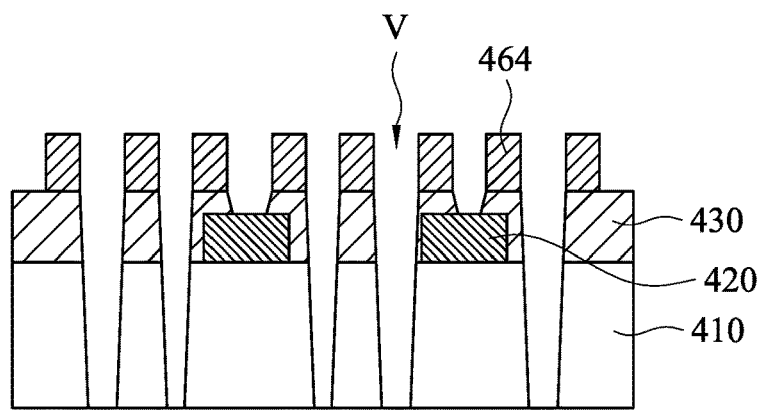

In FIG. 4G, portions of the planarization layer 430 uncovered by the second spacers 464 and portions of the IMD layer 410 uncovered by the second spacers 464 and the block patterns 420 are etched to form trenches V. In this step, the second spacers 464 and the block patterns 420 are used as hard masks, and the IMD layer 410 is etched back in the portions uncovered by the second spacers 464 and the block patterns 420. The etching process for forming the trenches V may be an anisotropic etching process with low selectivity with respect to the block patterns 420 and the second spacers 464, such as a reactive ion etching process, a plasma etching process, a dry etching process, a wet etching process, or another suitable etching process.

Figure 4H:
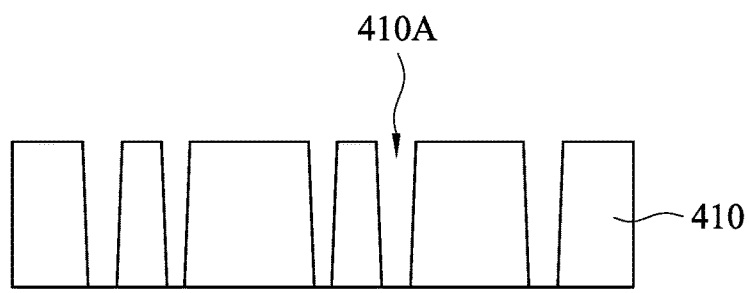

In FIG. 4H, after the trenches V are formed, the second spacers 464, the planarization layer 430 and the block patterns 420 are removed, and the IMD layer 410 is remained with trenches 410A. The second spacers 464, the planarization layer 430 and the block patterns 420 may be removed by utilizing, for example, a dry etching process, a wet etching process, combinations thereof, or another suitable etching process.

Figure 4I:
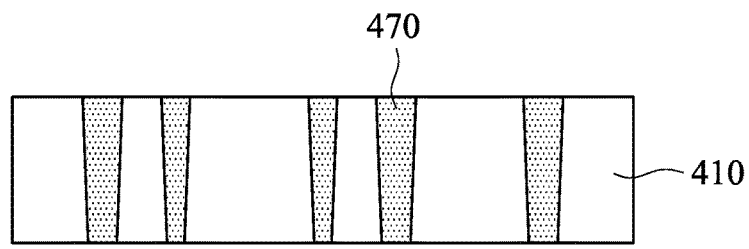

In FIG. 4I, a metal material is filled into the trenches 410A to form metal lines 470. The metal material for forming the metal lines 470 may be, for example, tantalum nitride, titanium nitride, titanium, cobalt, copper, tungsten, aluminum, combinations thereof, and/or another suitable material. After the trenches 410A are filled with the metal material, a CMP process may be performed to remove unwanted portion of the metal material on the IMD layer 410 and to planarize the upper surface of the metal lines 470.

In the embodiments of FIG. 4A to FIG. 4I, the block patterns 420 and the second spacers 464 are used as hard masks on different layers, which may help forming trenches 410A with narrower widths and good critical dimension uniformity by using the typical immersion lithography tool for forming the metal lines 470.

Figure 5A:
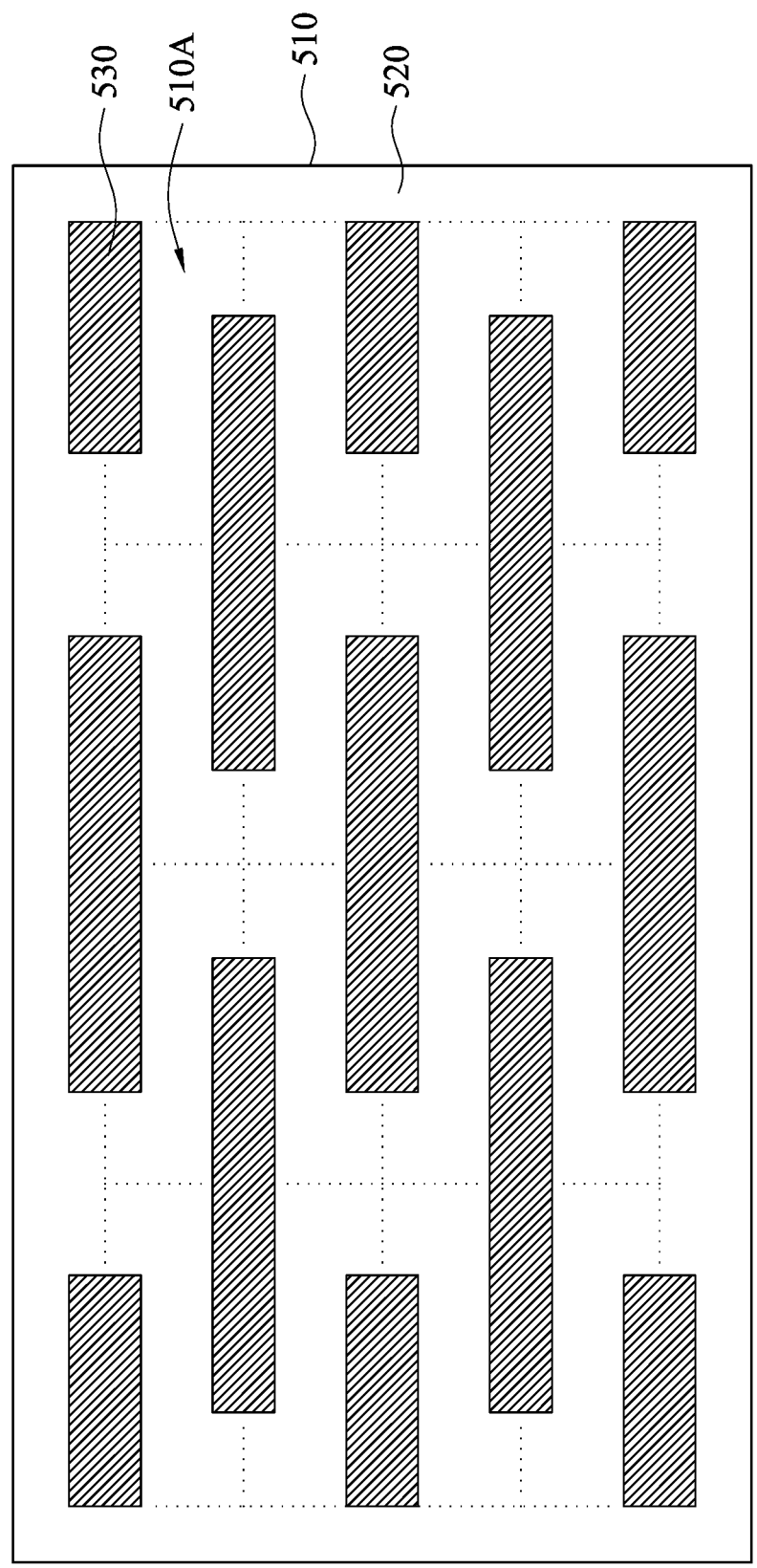
FIG. 5A to FIG. 5H are schematic top views of intermediate stages in the formation of metal lines of a semiconductor device in accordance with some embodiments of the present disclosure.

FIG. 5A to FIG. 5H are schematic top views of intermediate stages in the formation of metal lines of a semiconductor device in accordance with some embodiments of the present disclosure. The semiconductor device of which the metal lines are formed by the processes illustrated in FIG. 5A to FIG. 5H may be, for example, an SRAM device. As shown in FIG. 5A, an IMD layer 520 is provided on a substrate 510 which includes cell regions 510A arranged in rows and columns, and block patterns 530 are formed on the IMD layer 520 and at boundaries of the cell regions 510A. In FIG. 5A and the following FIG. 5B to FIG. 5H, only four rows and four columns of cell regions 510A are shown for illustrative simplicity. The substrate 510 may be, for example, a semiconductor wafer, an SOI substrate, a GOI substrate, a bulk substrate, or the like. The IMD layer 520 may be formed from silicon oxide, silicon nitride, silicon oxynitride, TEOS oxide, undoped silicon glass, doped silicon glass such as BSG, PSG, BPSG and FSG, low-k electric, combinations thereof, and/or another suitable material. The IMD layer 520 may be formed by utilizing a deposition process such as a CVD process and a high density plasma CVD process, a spin-on coating process, a sputtering process, and/or another suitable process. The dielectric constant of the high-K dielectric for forming the IMD layer 520 may be less than 3. The IMD layer 520 may be formed with a thickness in a range from about 5 nanometers to about 200 nanometers.

The block patterns 530 may be formed from polysilicon, amorphous silicon, silicon-based conductor, boron doped polysilicon, boron doped amorphous silicon, titanium nitride, tantalum nitride, silicon nitride, high-K dielectric, combinations thereof, and/or another suitable material. The dielectric constant of the high-K dielectric for forming the block patterns 530 may be greater than 10. The block patterns 530 may be formed by utilizing a deposition process and a patterning process (e.g. a lithography process and an etching process). The block patterns 530 may be formed with a thickness in a range from about 20 angstroms to about 1000 angstroms.

Figure 5B:
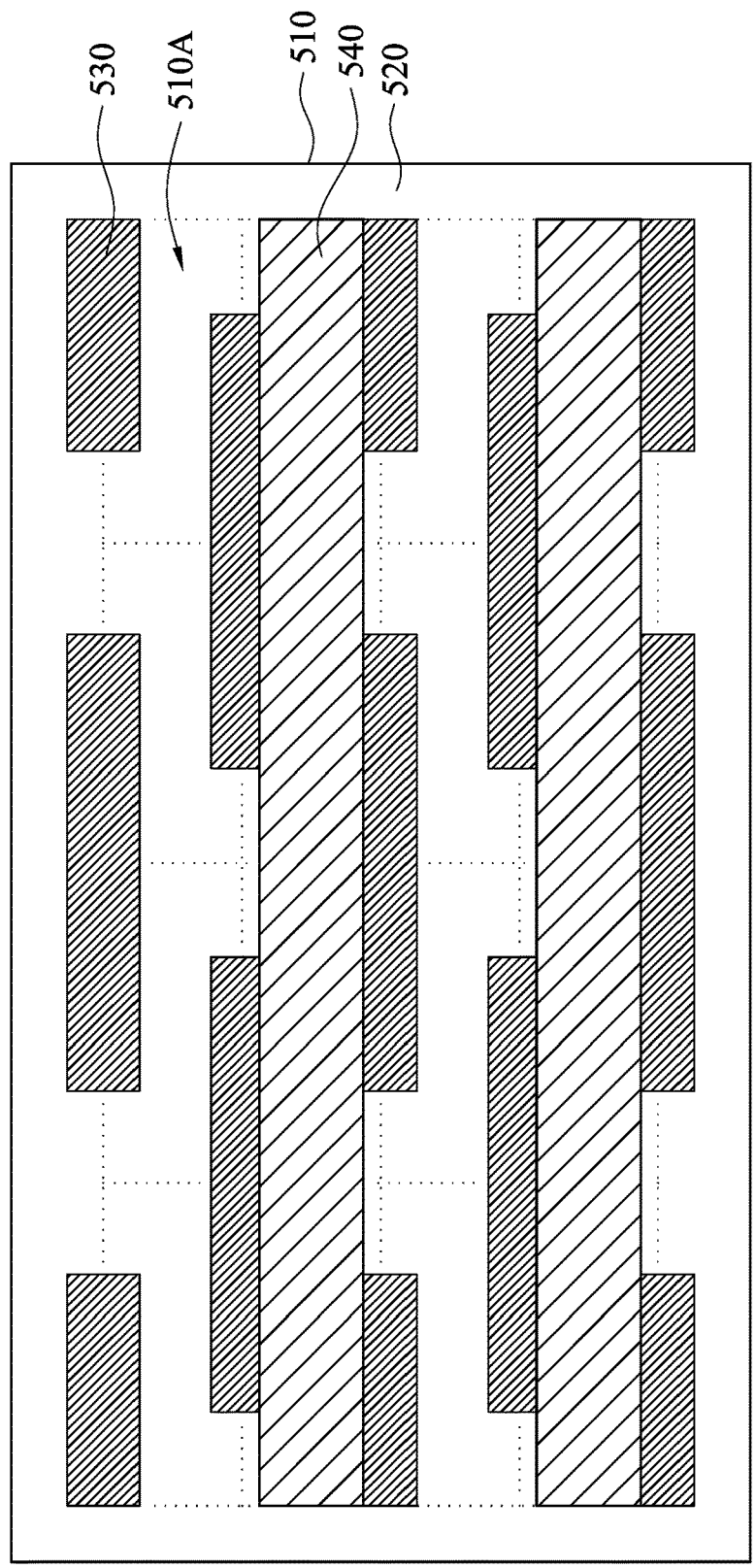

In FIG. 5B, a planarization layer (not shown) is formed on the block patterns 530 and the IMD layer 520, and dummy patterns 540 are formed on the planarization layer (not shown). The planarization layer (not shown) may be formed from oxide, nitride, silicon oxynitride, combinations thereof, and/or another suitable material. The planarization layer (not shown) may be formed by utilizing a deposition process and a CMP process. As shown in FIG. 5B, the dummy patterns 540 are formed at the second and fourth rows of memory cells 510A. The dummy patterns 540 may be formed from oxide, nitride-containing dielectric, silicon nitride, silicon oxynitride, titanium nitride, tantalum nitride, combinations thereof, and/or another suitable material. The dummy patterns 540 may be formed by utilizing a deposition process and a patterning process. The patterning process for forming the dummy patterns 540 may be performed by using, for example, a positive photoresist in combination with a clear tone mask, or a negative photoresist in combination with a dark tone mask. The patterning process for forming the dummy patterns 540 may include a lithography process and an etching process. The dummy patterns 540 may be formed with a thickness in a range from about 20 angstroms to about 2000 angstroms.

Figure 5C:
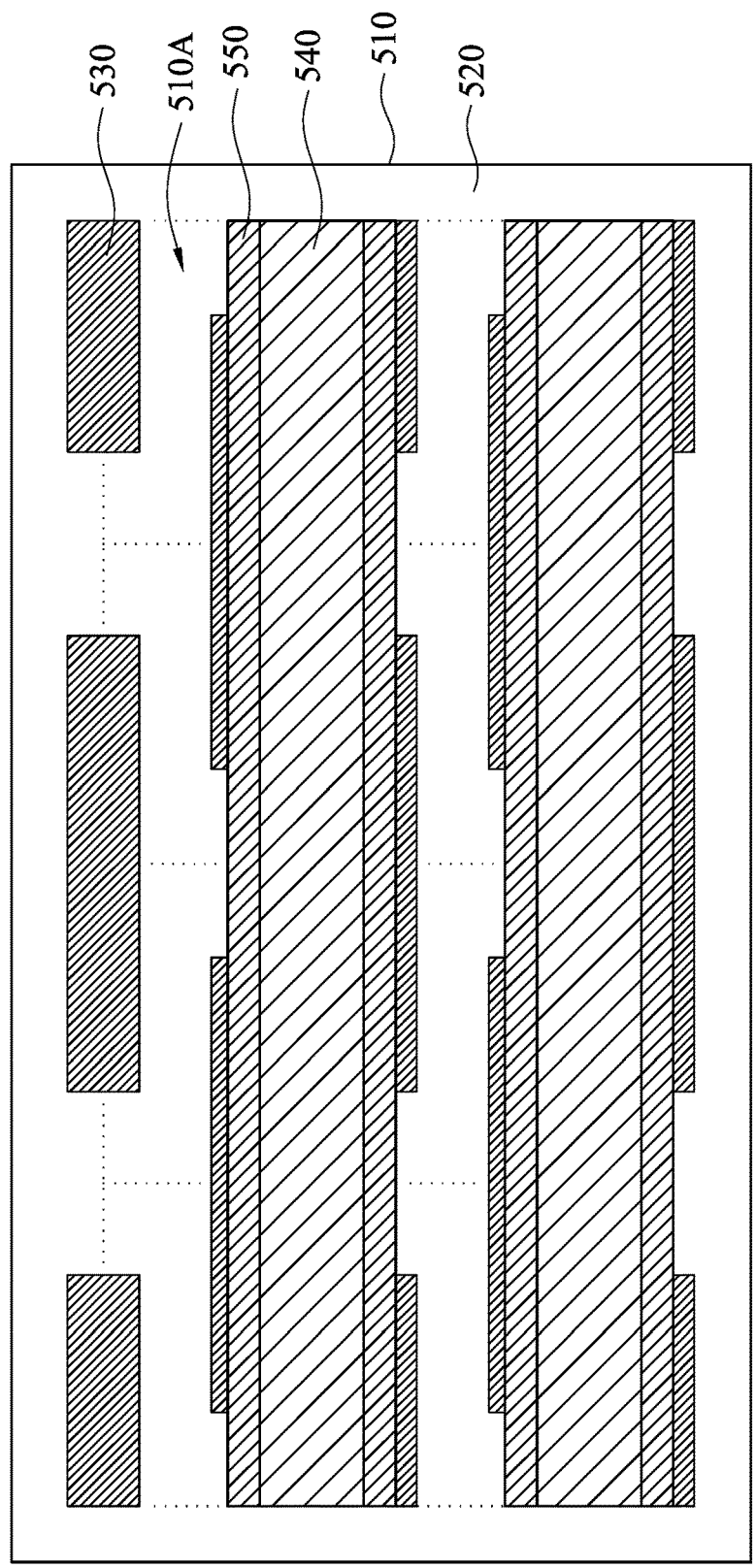

In FIG. 5C, first spacers 550 are formed on two opposite sidewalls of the dummy patterns 540. The first spacer 550 may be formed from silicon oxide, silicon nitride, silicon carbide, high-k dielectric, low-k dielectric, combinations thereof, or another suitable material. The first spacers 550 may be formed by utilizing a deposition process and a patterning process (e.g. a lithography process and an etching process). The first spacers 550 may be formed with a thickness in a range from about 20 angstroms to about 1000 angstroms.

Figure 5D:
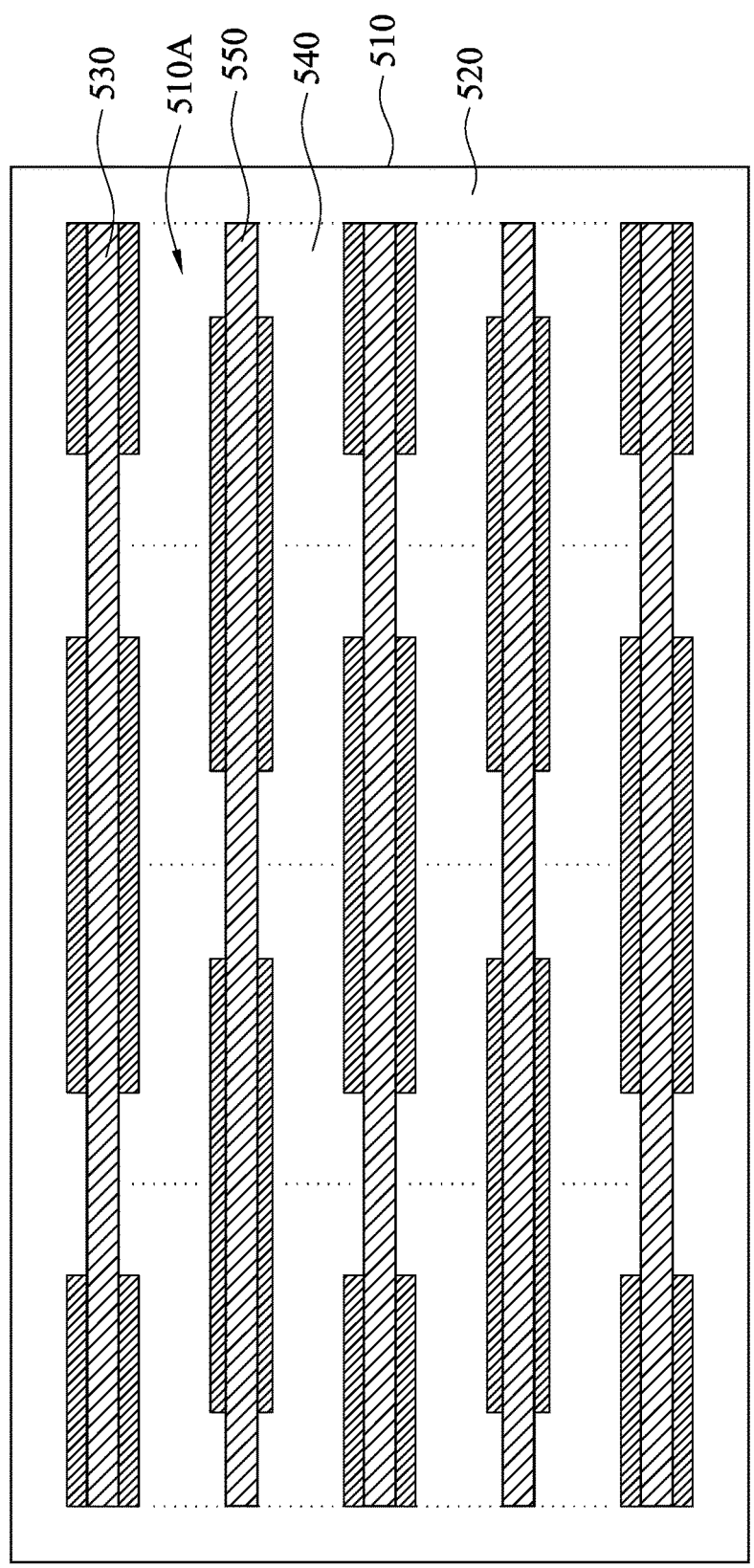

In FIG. 5D, after the first spacers 550 are formed, the dummy patterns 540 are then removed. The dummy patterns 540 may be removed by utilizing a dry etching process, a wet etching process, combinations thereof, or another suitable process.

Figure 5E:
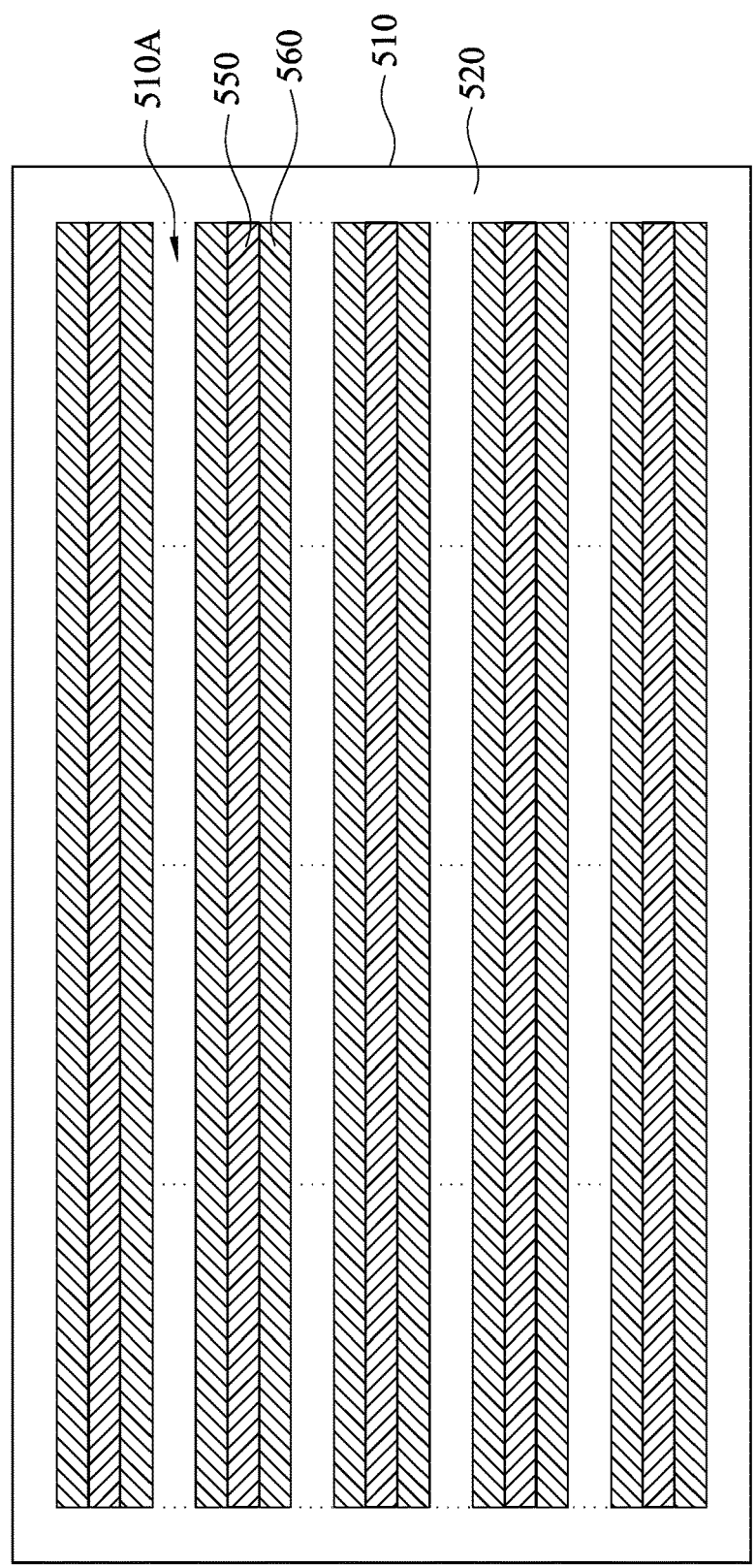

In FIG. 5E, second spacers 560 are formed on two opposite sidewalls of the first spacers 550. The second spacer 560 may be formed from silicon oxide, silicon nitride, silicon carbide, high-k dielectric, low-k dielectric, combinations thereof, or another suitable material. The second spacers 560 may be formed by utilizing a deposition process and a patterning process (e.g. a lithography process and an etching process). The second spacers 560 may be formed with a thickness in a range from about 20 angstroms to about 700 angstroms.

Figure 5F:
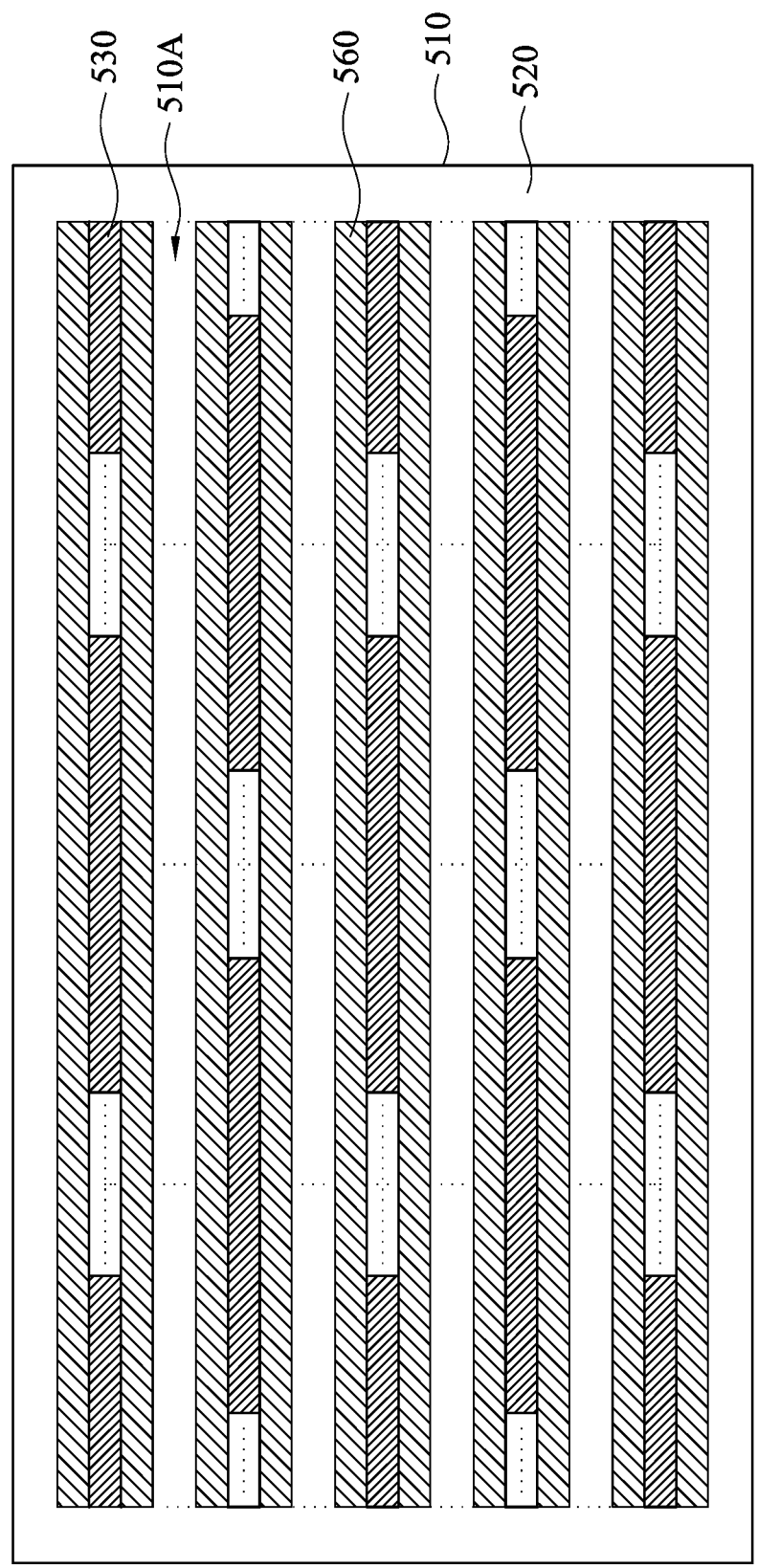

In FIG. 5F, after the second spacers 560 are formed, the first spacers 550 are then removed. The first spacers 550 may be removed by utilizing a dry etching process, a wet etching process, combinations thereof, or another suitable process.

Figure 5G:
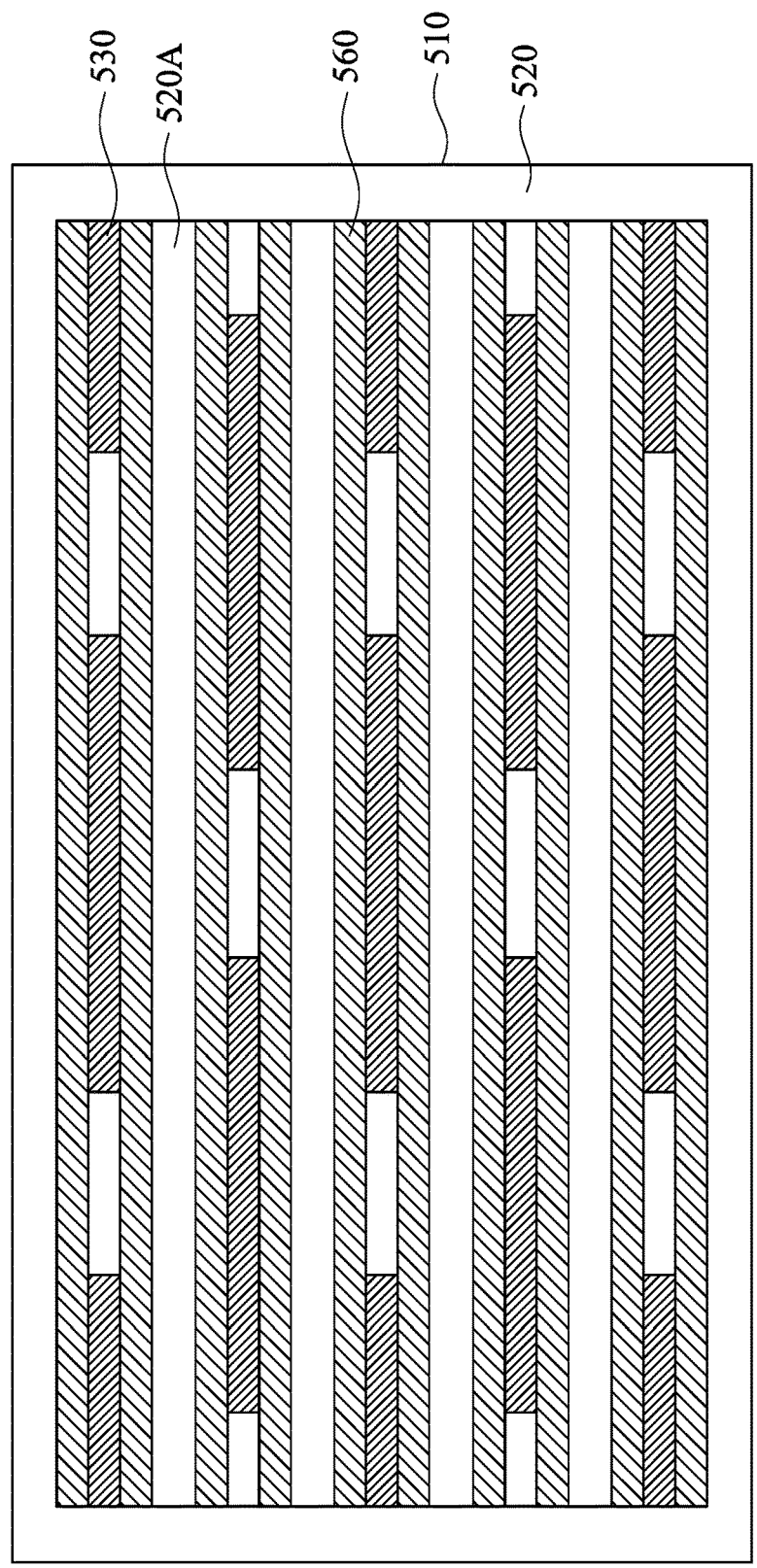

In FIG. 5G, portions of the IMD layer 520 uncovered by the second spacers 560 and the block patterns 530 are etched to form trenches 520A of the IMD layer 520. In this step, the dummy patterns 540 and the second spacers 560 are used as hard masks, and the IMD layer 520 is etched back in the portions uncovered by the second spacers 560 and the block patterns 530. The etching process for forming the trenches 520A may be an anisotropic etching process with low selectivity with respect to the block patterns 530 and the second spacers 560, such as a reactive ion etching process, a plasma etching process, a dry etching process, a wet etching process, or another suitable etching process.

Figure 5H:
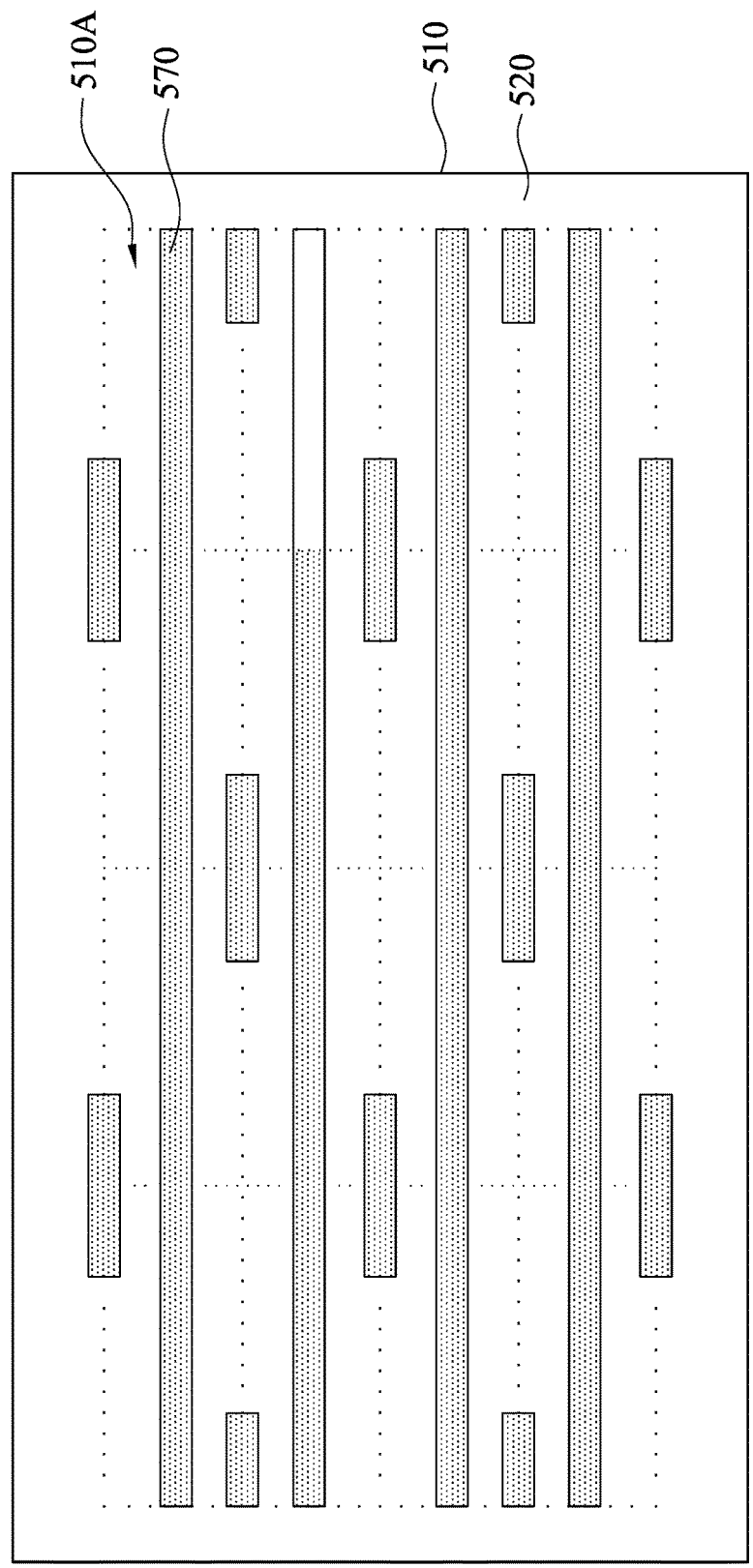

In FIG. 5H, after the trenches 520A are formed, the second spacers 560, the planarization layer (not shown) and the block patterns 530 are removed, and then a metal material is filled into the trenches 520A to form metal lines 570. The second spacers 560, the planarization layer (not shown) and the block patterns 530 may be removed by utilizing, for example, a dry etching process, a wet etching process, combinations thereof, or another suitable etching process. The metal material for forming the metal lines 570 may be, for example, tantalum nitride, titanium nitride, titanium, cobalt, copper, tungsten, aluminum, combinations thereof, and/or another suitable material. The metal lines 570 may be formed by utilizing a CMP process.

The metal lines 570 may be, for example, word lines WL, power lines $V_{CC}$ and/or complementary power lines $V_{SS}$ of the memory device 200. In such case, subsequent processes are performed on the structure shown in FIG. 5H to form the other components (i.e. the bit lines BL, the complementary bit lines BLB, the pull-up transistors PU_1 and PU_2, the pull-down transistors PD_1 and PD_2 and the pass-gate transistors PG_1 and PG_2) of the memory device 200.

In the embodiments of FIG. 5A to FIG. 5H, the block patterns 530 and the second spacers 560 are used as hard masks on different layers, which may help forming trenches 520A with narrower widths and good critical dimension uniformity by using the typical immersion lithography tool for forming the metal lines 570. The memory device 200 may be formed in a 7 nm technology node or advanced by applying the embodiments of FIG. 5A to FIG. 5H.

It is noted that various alternations and modifications may be derived from embodiments described above. For example, in alternative embodiments for the formation of metal lines shown in FIG. 4A to FIG. 4I, the process of forming metal lines deploys only the first spacers 462 but without the second spacers 464 with respect to various arrangements and/or widths of the dummy patterns 450 and the block patterns 420.

In accordance with some embodiments, a method for forming a semiconductor device includes the following steps. An IMD layer is provided on a substrate. Block patterns are formed on the IMD layer. Dummy patterns are formed on the IMD layer and the block patterns. Portions of the IMD layer uncovered by the dummy patterns and the block patterns are etched to form trenches of the IMD layer. After the trenches of the IMD layer are formed, the dummy patterns and the block patterns are removed, and a metal material is filled into the trenches to form metal lines.

In accordance with certain embodiments, a method for forming a semiconductor device includes the following steps. An IMD layer is provided on a substrate. Block patterns are formed on the IMD layer. A planarization layer is deposited on the IMD layer and the block patterns. Dummy patterns are formed on the planarization layer. Spacers are formed along sidewalls of the dummy patterns, and then the dummy patterns are removed. Portions of the planarization layer and the IMD layer uncovered by the spacers and the block patterns are etched to form trenches of the IMD layer. After the trenches of the IMD layer are formed, the spacers, the block patterns and the remaining planarization layer are removed, and a metal material is filled into the trenches to form metal lines.

In accordance with some embodiments, a method for forming a semiconductor device includes the following steps. An IMD layer is provided on a substrate. Block patterns are formed on the IMD layer. A planarization layer is deposited on the IMD layer and the block patterns. Dummy patterns are formed on the planarization layer. First spacers are formed along sidewalls of the dummy patterns, and then the dummy patterns are removed. Second spacers are formed along sidewalls of the first spacers, and then the first spacers are removed. Portions of the planarization layer and the IMD layer uncovered by the second spacers and the block patterns are etched to form trenches of the IMD layer. After the trenches of the IMD layer are formed, the second spacers, the block patterns and the remaining planarization layer are removed, and a metal material is filled into the trenches to form metal lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:

providing an intermediate dielectric (IMD) layer on a substrate;

forming a plurality of block patterns on the IMD layer;

depositing a planarization layer on the IMD layer and the block patterns;

forming a plurality of dummy patterns on the planarization layer;

forming a plurality of spacers along sidewalls of the dummy patterns;

removing the dummy patterns;

etching portions of the planarization layer and the IMD layer uncovered by the spacers and the block patterns to form a plurality of trenches of the IMD layer;

removing the spacers, the block patterns and the remaining planarization layer; and filling the trenches of the IMD layer with a metal material to form metal lines.

2. The method of claim 1, wherein the block patterns are formed from polysilicon.

3. The method of claim 1, wherein the block patterns are formed from polysilicon, amorphous silicon, silicon-based conductor, boron doped polysilicon, boron doped amorphous silicon, titanium nitride, tantalum nitride, silicon nitride, high-K dielectric, or combinations thereof.

4. The method of claim 1, wherein the dummy patterns are formed from oxide, nitride-containing dielectric, silicon nitride, silicon oxynitride, titanium nitride, tantalum nitride, or combinations thereof.

5. The method of claim 1, wherein the planarization layer is formed from oxide, nitride, silicon oxynitride, or combinations thereof.

6. The method of claim 1, wherein the metal material is selected from tantalum nitride, titanium nitride, titanium, cobalt, copper, tungsten, aluminum, or combinations thereof.

7. The method of claim 1, wherein the spacers are removed by a wet etching process, a dry etching process or a combination thereof.

8. A method of forming a semiconductor device, comprising:
providing an intermediate dielectric (IMD) layer on a substrate;
forming a plurality of block patterns on the IMD layer;
depositing a planarization layer on the IMD layer and the block patterns;
forming a plurality of dummy patterns on the planarization layer;
forming a plurality of first spacers along sidewalls of the dummy patterns;
removing the dummy patterns;
forming a plurality of second spacers along sidewalls of the first spacers;
removing the first spacers;
etching portions of the planarization layer and the IMD layer uncovered by the second spacers and the block patterns to form a plurality of trenches of the IMD layer;
removing the second spacers, the block patterns and the remaining planarization layer; and
filling the trenches of the IMD layer with a metal material to form metal lines.

9. The method of claim 8, wherein the block patterns are formed from polysilicon.

10. The method of claim 8, wherein the block patterns are formed from a material selected from polysilicon, amorphous silicon, silicon-based conductor, boron doped polysilicon, boron doped amorphous silicon, titanium nitride, tantalum nitride, silicon nitride, high-K dielectric, or combinations thereof.

11. The method of claim 8, wherein the dummy patterns are formed from oxide, nitride-containing dielectric, silicon nitride, silicon oxynitride, titanium nitride, tantalum nitride, or combinations thereof.

12. The method of claim 8, wherein the planarization layer is formed from oxide, nitride, silicon oxynitride, or combinations thereof.

13. The method of claim 8, wherein the metal material is selected from tantalum nitride, titanium nitride, titanium, cobalt, copper, tungsten, aluminum, or combinations thereof.

14. The method of claim 8, wherein the first spacers and the second spacers are removed by a wet etching process, a dry etching process or a combination thereof.

15. A method of forming a memory device, comprising:
providing an intermediate dielectric (IMD) layer on a substrate that has a plurality of cell regions;
forming a plurality of block patterns on the IMD layer, the block patterns respectively at boundaries of the cell regions;
depositing a planarization layer on the IMD layer and the block patterns;
forming a plurality of dummy patterns on the planarization layer;
forming a plurality of spacers along sidewalls of the dummy patterns;
removing the dummy patterns;
etching portions of the planarization layer and the IMD layer uncovered by the spacers and the block patterns to form a plurality of trenches of the IMD layer;
removing the spacers, the block patterns and the remaining planarization layer; and
filling the trenches of the IMD layer with a metal material to form at least one of word lines, power lines and complementary power lines of the memory device.

16. The method of claim 15, wherein the block patterns are formed from polysilicon, amorphous silicon, silicon-based conductor, boron doped polysilicon, boron doped amorphous silicon, titanium nitride, tantalum nitride, silicon nitride, high-K dielectric, or combinations thereof.

17. The method of claim 15, wherein the dummy patterns are formed from oxide, nitride-containing dielectric, silicon nitride, silicon oxynitride, titanium nitride, tantalum nitride, or combinations thereof.

18. The method of claim 15, wherein the metal material is selected from tantalum nitride, titanium nitride, titanium, cobalt, copper, tungsten, aluminum, or combinations thereof.

19. The method of claim 15, wherein the spacers are removed by a wet etching process, a dry etching process or a combination thereof.

20. The method of claim 15, wherein the memory device is a static random access memory (SRAM) device.

* * * * *